United States Patent
Kankani et al.

(10) Patent No.: US 10,509,598 B2
(45) Date of Patent: Dec. 17, 2019

(54) METHOD AND APPARATUS FOR PROGRAMMING FLASH BASED STORAGE USING SEGMENTED WRITES

(71) Applicant: Western Digital Technologies, Inc., San Jose, CA (US)

(72) Inventors: Navneeth Kankani, Fremont, CA (US); Sarath Chandran Puthen Thermadam, San Jose, CA (US); Namasivayam Raghunathan, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 3 days.

(21) Appl. No.: 15/897,923

(22) Filed: Feb. 15, 2018

(65) Prior Publication Data

US 2019/0250851 A1 Aug. 15, 2019

(51) Int. Cl.
| | |
|---|---|
| *G11C 16/10* | (2006.01) |
| *G06F 3/06* | (2006.01) |
| *G11C 16/26* | (2006.01) |
| *G11C 16/04* | (2006.01) |

(52) U.S. Cl.
CPC .......... *G06F 3/0659* (2013.01); *G06F 3/0604* (2013.01); *G06F 3/0679* (2013.01); *G11C 16/10* (2013.01); *G11C 16/26* (2013.01); *G11C 16/0483* (2013.01)

(58) Field of Classification Search
CPC .... G06F 3/0659; G06F 3/0679; G06F 3/0604; G11C 16/26; G11C 16/10; G11C 16/0483
See application file for complete search history.

(56) References Cited

U.S. PATENT DOCUMENTS

| | | | |
|---|---|---|---|
| 7,623,390 B2 | 11/2009 | Salter, III et al. | |
| 8,964,498 B2 | 2/2015 | Shin et al. | |
| 9,195,406 B2 | 11/2015 | Cabrera et al. | |
| 9,208,023 B2 | 12/2015 | Lasser | |
| 9,274,866 B2 | 3/2016 | Camp et al. | |
| 9,640,265 B1* | 5/2017 | Honma | G11C 11/5628 |
| 9,747,044 B2 | 8/2017 | Nanduri et al. | |
| 2010/0315880 A1* | 12/2010 | Joo | G06F 11/1048 365/185.22 |
| 2013/0191601 A1* | 7/2013 | Peterson | G06F 12/0868 711/137 |

(Continued)

OTHER PUBLICATIONS

Thanigai, Priya, "FRAMs as alternatives to flash memory in embedded designs"; http://www.embedded.com/print/4390688; Jul. 19, 2012; 3 pages.

(Continued)

*Primary Examiner* — Khamdan N. Alrobaie
(74) *Attorney, Agent, or Firm* — Loza & Loza, LLP; Gabriel Fitch

(57) ABSTRACT

Systems and methods are disclosed for writing data to a non-volatile memory (NVM) using a segmented write process. The NVM uses a plurality of program loops to write data to the NVM. The NVM groups the plurality of program loops into a plurality of write segments, and each write segment includes a distinct set of the plurality of program loops. The write segments are separated by a dwell time that allows read access before the data is written to the NVM.

27 Claims, 9 Drawing Sheets

(56) References Cited

U.S. PATENT DOCUMENTS

| | | | |
|---|---|---|---|
| 2016/0188219 A1* | 6/2016 | Peterson ............... | G06F 3/0616 |
| | | | 711/103 |
| 2016/0188221 A1* | 6/2016 | Janik ..................... | G06F 3/0611 |
| | | | 711/103 |
| 2017/0139590 A1 | 5/2017 | Hsu et al. | |

OTHER PUBLICATIONS

Cai et al, "Vulnerabilities in MLC NAND Flash Memory Programming: Experimental Analysis, Exploits, and Mitigation Techniques"; 2017 IEEE International Syposium on HPCA; http://ieeexplore.ieee.org/document/7920813/; DOI 10.1109/HPCA.2017.61; Feb. 2017; 12 pages.

* cited by examiner

METHOD AND APPARATUS FOR PROGRAMMING FLASH BASED STORAGE USING SEGMENTED WRITES

FIELD

Aspects of the disclosure relate generally to solid state storage devices, and more specifically, to storing data in a solid state storage utilizing flash memory.

INTRODUCTION

In a variety of consumer electronics and computers, solid state drives incorporating non-volatile memories (NVMs) are frequently replacing or supplementing conventional rotating hard disk drives for mass storage. A solid state drive (SSD) or solid state storage may use negative-AND (NAND) flash memory cells for its high density and low cost per cell relative to other generally available non-volatile memory technology. Each NAND memory cell can be programmed to store one or more bits. A single level cell (SLC) flash memory may be programmed to store one bit per cell. Some flash memory may have cells that can store two or more bits per cell. This type of flash memory is generally referred to as multi-level cell (MLC) flash memory. Some specific examples are triple-level cell (TLC) flash memory that can store 3 bits per cell and quad-level cell (QLC) flash memory that can store 4 bits per cell. In general, more read and write cycles are used to access data in NAND flash memory configured to store more bits per cell than those used in SLC flash memory. However, higher bit density could lead to more read-write collisions when operating MLC flash memory cells.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Aspects of the disclosure provide systems and methods for writing data to a non-volatile memory using a segmented write process.

One aspect of the disclosure provides a method of operating a non-volatile memory (NVM). The NVM receives a write command including first data. The NVM determines characteristics for a plurality of program loops used to write the first data to the NVM. For example, the characteristics may be a number of program loops and/or a desired threshold voltage programmed to a cell using the program loops. The NVM groups the plurality of program loops into a plurality of write segments, and each write segment includes a distinct set of the plurality of program loops. The NVM determines a dwell time between adjacent write segments, and writes the first data to the NVM by performing the plurality of write segments that are separated in time by the dwell time.

Another aspect of the disclosure provides a solid state device (SSD) that includes a non-volatile memory (NVM) and a controller operatively coupled to the NVM. The controller is configured to receive a write command including first data. The controller determines characteristics for a plurality of program loops used to write the first data to the NVM. The controller groups the plurality of program loops into a plurality of write segments, and each write segment includes a distinct set of the program loops. The controller determines a dwell time between adjacent write segments, and writes the first data to the NVM by performing the plurality of write segments that are separated by the dwell time.

Another aspect of the disclosure provides a non-volatile memory (NVM). The NVM includes means for receiving a write command including first data. The NVM further includes means for determining characteristics for a plurality of program loops used to write the first data to the NVM. The NVM further includes means for grouping the plurality of program loops into a plurality of write segments, and each write segment includes a distinct set of the plurality of program loops. The NVM further includes means for determining a dwell time between adjacent write segments. The NVM further includes means for writing the first data to the NVM by performing the plurality of write segments that are separated in time by the dwell time.

DETAILED DESCRIPTION

Figure 1:
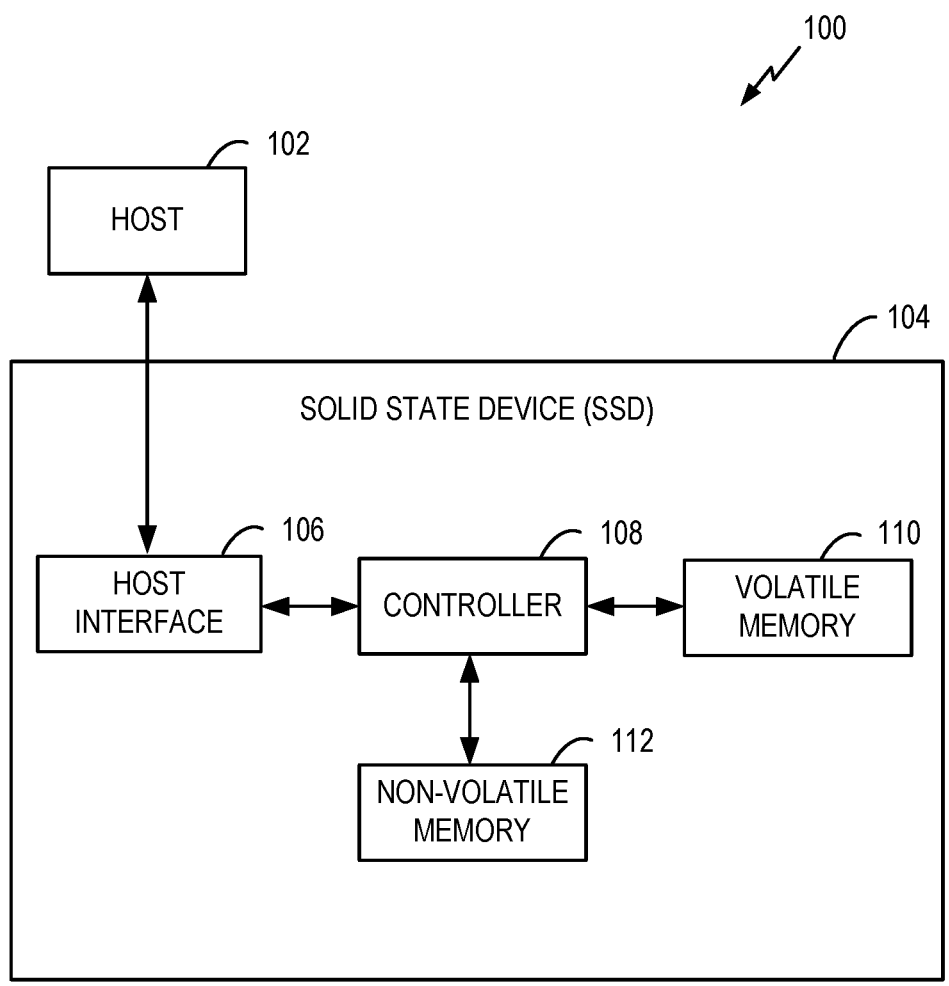
FIG. 1 is a diagram illustrating a computing system that can perform various functions using a non-volatile memory (NVM) in accordance with some embodiments of the disclosure.

Referring now to the drawings, systems and methods for storing data in a solid state storage using segmented writes are illustrated. In the illustrated embodiments, the overall read latency, endurance, and performance of a flash based solid state storage can be improved by proactively segmenting a flash program procedure into a number of write segments that are separated by a predetermined time delay (dwell time). In each write segment, a number of program loops are performed to write data to flash cells to be programmed. The write segments for programming different flash dies on the same channel can be staggered such that the memory controller can read data from flash cells during a dwell time between two write segments. Adding a finite delay (dwell time) between write segments can improve short term data retention (STDR), error rate characteristics, and threshold voltage margins.

FIG. 1 is a block diagram illustrating a computing system that can perform various functions in accordance with some embodiments of the disclosure. The system 100 includes a host 102 and a solid state device (SSD) 104 coupled to the host 102. The host 102 provides various commands to the SSD 104 for transferring data between the host 102 and the SSD 104. For example, the host 102 may provide a write command to the SSD 104 for writing or programming data to the SSD 104, or a read command to the SSD 104 for reading or retrieving data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, a digital phone, or the like.

In some embodiments, the SSD 104 includes a host interface 106, a controller 108, a volatile memory 110, and a non-volatile memory (NVM) 112. One example of NVM is flash memory (e.g., NAND flash). The host interface 106 is coupled to the controller 108 and facilitates communication and data transfer between the host 102 and the controller 108. Additionally, the controller 108 is operatively coupled to the volatile memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, a Peripheral Component Interconnect Express (PCIe) interface, a Common Flash Memory Interface (CFI), a Non-Volatile Memory Express (NVMe) interface, etc. In some embodiments, the host 102 and the SSD 104 may be included in a same unit or system. In other embodiments, the SSD 104 may be remote with respect to the host 102 or may be contained in a remote computing system in data communication with the host 102. For example, the host 102 may communicate with the SSD 104 through a wired and/or wireless communication link. In some examples, the SSD 104 may be included in a network based storage system.

The controller 108 controls the operation of the SSD 104. In various embodiments, the controller 108 receives commands from the host 102 through the host interface 106 and performs the commands to transfer data between the host 102 and the SSD (e.g., NVM 112 and volatile memory 110). The controller 108 may be implemented as any type of processing device, such as a microprocessor, a microcontroller, an embedded controller, a logic circuit, software, firmware, or the like, for controlling the operation of the SSD 104. In one embodiment, the controller 108 can be a special purpose controller specifically configured/programmed to perform any of the functions contained within the application.

In some embodiments, some or all of the functions, processes, and procedures described herein as being performed by the controller 108 may instead be performed by another element of the SSD 104. The functions of the host interface 106 and the controller 108 may be implemented in the same device. For example, the SSD 104 may include a microprocessor, a microcontroller, an embedded controller, a logic circuit, a field-programmable gate array (FPGA), an application-specific integrated circuit (ASIC), software, firmware, or any kind of processing device, for performing one or more of the functions described herein as being performed by the controller 108 and/or host interface 106. In some embodiments, one or more of the functions described herein as being performed by the controller 108 and/or host interface 106 are instead performed by the host 102. In some embodiments, some or all of the functions described herein as being performed by the controller 108 may instead be performed by another element such as a controller in a hybrid drive including both non-volatile memory elements and magnetic storage elements. In some embodiments, some or all of the functions described herein as being performed by the controller 108 may instead be performed by control circuitry included in the NVM 112. In some embodiments, the controller 108, volatile memory 110, and NVM 112 may be included in one or more modules.

The volatile memory 110 may be any memory, computing device, or system capable of storing data. The volatile memory 110 can maintain its data while the device is powered or energized. For example, the volatile memory 110 may be a random-access memory (RAM) such as a dynamic random-access memory (DRAM), a static random-access memory (SRAM), a synchronous dynamic random-access memory (SDRAM), or the like. In various embodiments, the controller 108 uses the volatile memory 110, or a portion thereof, to store data during the transfer of data between the host 102 and the NVM 112. For example, the volatile memory 110 may be a cache memory that may be used to store recently accessed data to improve access speed of the SSD 104 or data to be stored in the NVM 112. In some examples, the volatile memory 110 may be used as a buffer to store immediate data to be stored in the NVM 112. In some embodiments, the SSD 104 may not include the volatile memory 110.

The controller 108 can control writing data to and reading data from the NVM 112. In some embodiments, the NVM 112 may include one or more types of non-volatile data storages, such as a flash storage system (e.g., NAND based storage system), a solid state drive, a flash memory card, a secure digital (SD) card, a universal serial bus (USB) memory device, a CompactFlash card, a SmartMedia device, a flash storage array, a flash storage, an erasable programmable read-only-memory (EPROM), an electrically erasable programmable read-only-memory (EEPROM), magnetoresistive random-access memory, non-volatile RAM, ferroelectric RAM, or phase-change RAM, or the like.

Figure 2:
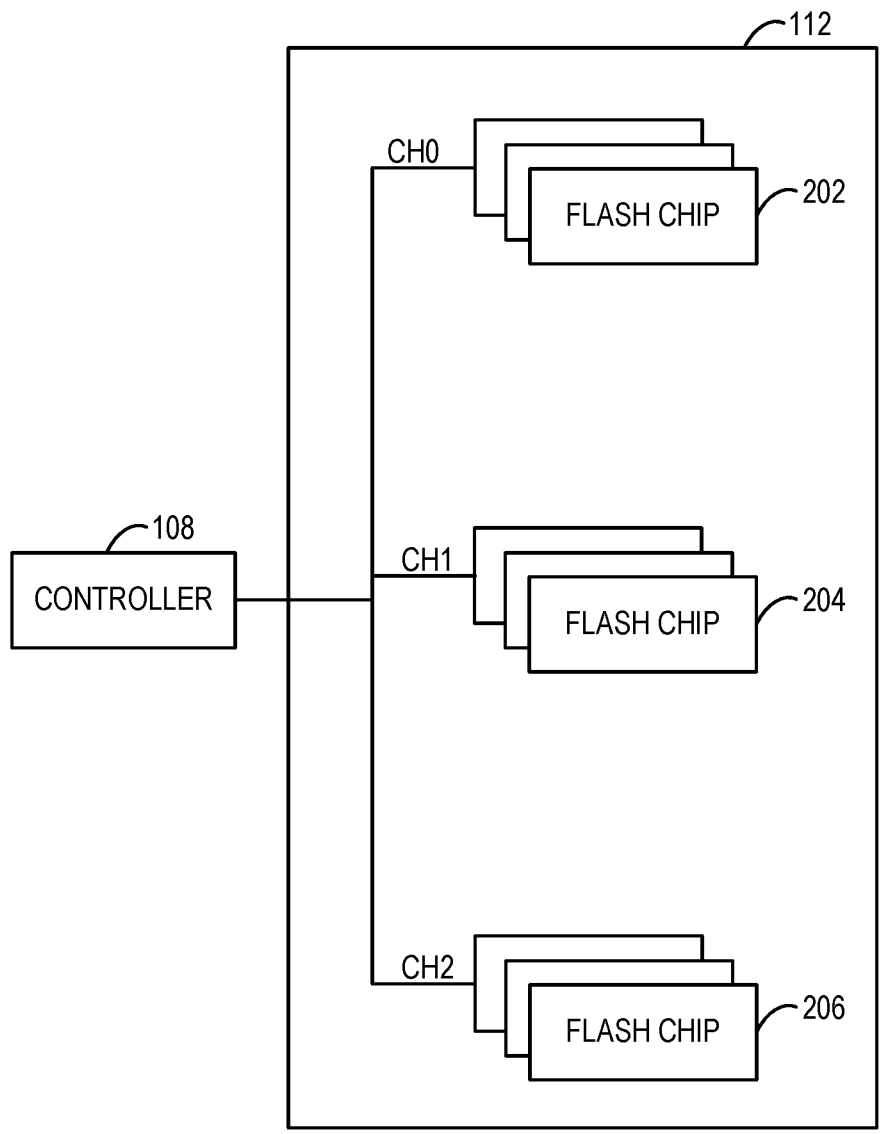
FIG. 2 is a block diagram illustrating the NVM of FIG. 1 in more detail in accordance with some embodiments of the disclosure.

FIG. 2 is a block diagram illustrating the NVM 112 in more detail in accordance with some embodiments of the disclosure. The NVM 112 may include flash chips arranged in multiple channels with each channel including one or more flash chips or flash packages. Each flash chip may include one or more flash dies each providing a plurality of memory cells for storing data. Three exemplary data channels CH0, CH1, CH2 are shown in FIG. 2. For example, a first channel CH0 can access a first group of flash chips 202, a second channel CH1 can access a second group of flash chips 204, and a third channel CH2 can access a third group of flash chips 206. The unit for reading and writing of a flash based storage (e.g., NAND flash) is a page that includes multiple flash cells. A number of pages are grouped into a block. In some embodiments, a unit for erasing data stored in a NAND flash is a block that includes a number of pages. A number of blocks are grouped into a plane. A logic unit (LUN) includes a plurality of planes. A flash based storage may include multiple LUNs. The controller 108 can issue commands to read or write a page of a plane independently of other planes. The controller 108 also can issue commands to erase a certain block of a plane in a LUN.

In general, writing data to a NAND flash is much slower than reading data from the flash. One reason of unpredictability in read latency of a flash based storage is due to write-read collisions at the flash chip. This problem of read-write collisions gets worse in higher bit density per cell flash storage. For example, when the controller 108 schedules a write command that is followed by a read command to access the flash chips 202 on the first channel (CH0), the read command may be blocked by the write command, causing read latency.

Figure 3:
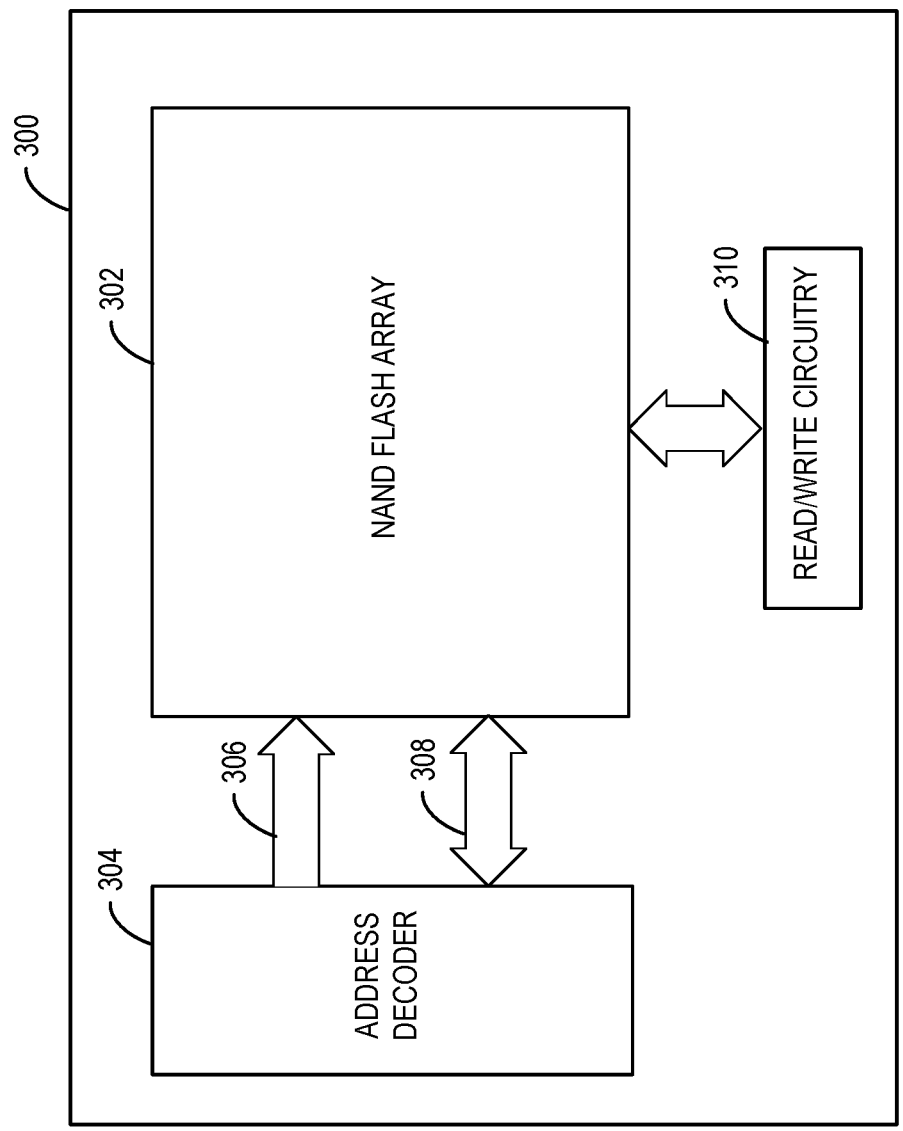
FIG. 3 is a conceptual block diagram of a NVM in accordance with one embodiment of the disclosure.

FIG. 3 is a conceptual block diagram of an exemplary flash based storage 300 including NAND flash memory in accordance with some embodiments of the disclosure. In some examples, the NVM 112 may be implemented using one or more flash based storage 300. In one embodiment, the flash based storage 300 includes a NAND flash memory array 302 that includes a plurality of flash memory cells or devices. The flash based storage 300 may include an address decoder 304 for addressing the NAND flash memory array 302 by selecting one or more wordlines and bit lines 306 connected to the desired cells. Therefore, data 308 may be written to or read from the memory array 302. The flash based storage 300 may include a read-write circuitry 310 that is configured to generate various signals (e.g., voltages and/or currents) for writing, programming, reading, erasing, and/or refreshing the memory cells of the NAND flash array 302. In some embodiments, the controller 108 may issue various commands to control the address decoder 304 and read/write circuitry 310. The read-write circuity 310 may also be configured to sense, detect, and determine the voltage and/or current of each cell of the array 302 to program data to and read data from the cells. Each memory cell may be programmed to a certain program state among a number of program states or levels. Each state corresponds to a specific binary value or bit value. For example, a cell can store an integer number B of bits when it is capable of being programmed to one of $2^B$ discrete program states or levels.

The read-write circuitry 310 may store data received from the host 102 or controller 108 in one or more predetermined pages each including multiple memory cells. When the host reads data (e.g., a file) from the NVM 112, the controller 108 and/or the read-write circuitry 310 can determine the page that stores the requested data, and the read-write circuitry 310 can generate the correct signals (e.g., read threshold voltage(s)) to read the data from that page. In some embodiments, the read-write circuitry 310 or its functions may be included in the controller 108. The read-write circuitry 310 may include buffers for storing data to be programmed to or read from the flash array 202. In some examples, the buffers may be SRAM or the like.

In some embodiments, the NAND flash array 302 may be implemented using multi-level cells (e.g., 2 bits/cell, 3 bits/cell or 4 bits/cell). To increase write (program) throughput, the controller can stripe the write request among flash chips across different channels. For example, the controller can first stripe data across channels (e.g., CH0, CH1, CH2 of FIG. 2), then the controller can stripe data across flash chips and/or dies (e.g., flash chips 202, 204, 206 of FIG. 2). Then, the controller can further stripe data across flash planes in a LUN.

In general, reading a flash memory cell involves measuring the flow of electricity through the cell. One or more reference or read voltages are applied across the cell (e.g., source and drain electrodes) and the current across the cell is measured. Possible binary values for SLC are 0 or 1, using one threshold voltage. Possible binary values for a 2 bits/cell MLC are 00, 10, 01, or 11, using three threshold voltages. Possible binary values for TLC are 000, 001, 010, 011, 100, 101, 110, 111, using seven threshold voltages.

Each binary value corresponds to a specific threshold voltage. For example, the lowest binary value may correspond to the highest voltage, the highest binary value may correspond to the lowest voltage, and intermediate binary values correspond to progressively different threshold voltages between the highest and lowest voltages. The correct threshold voltage of a cell for the stored binary value is set in a program process. To read a flash cell, different read voltages are applied successively, with a different read voltage being applied each time. Therefore, the more states a cell has, the more threshold voltage tests need be performed to read the stored data. For example, seven threshold voltage tests are used to read a TLC flash cell, and only one test is needed to read an SLC flash cell.

Figure 4:
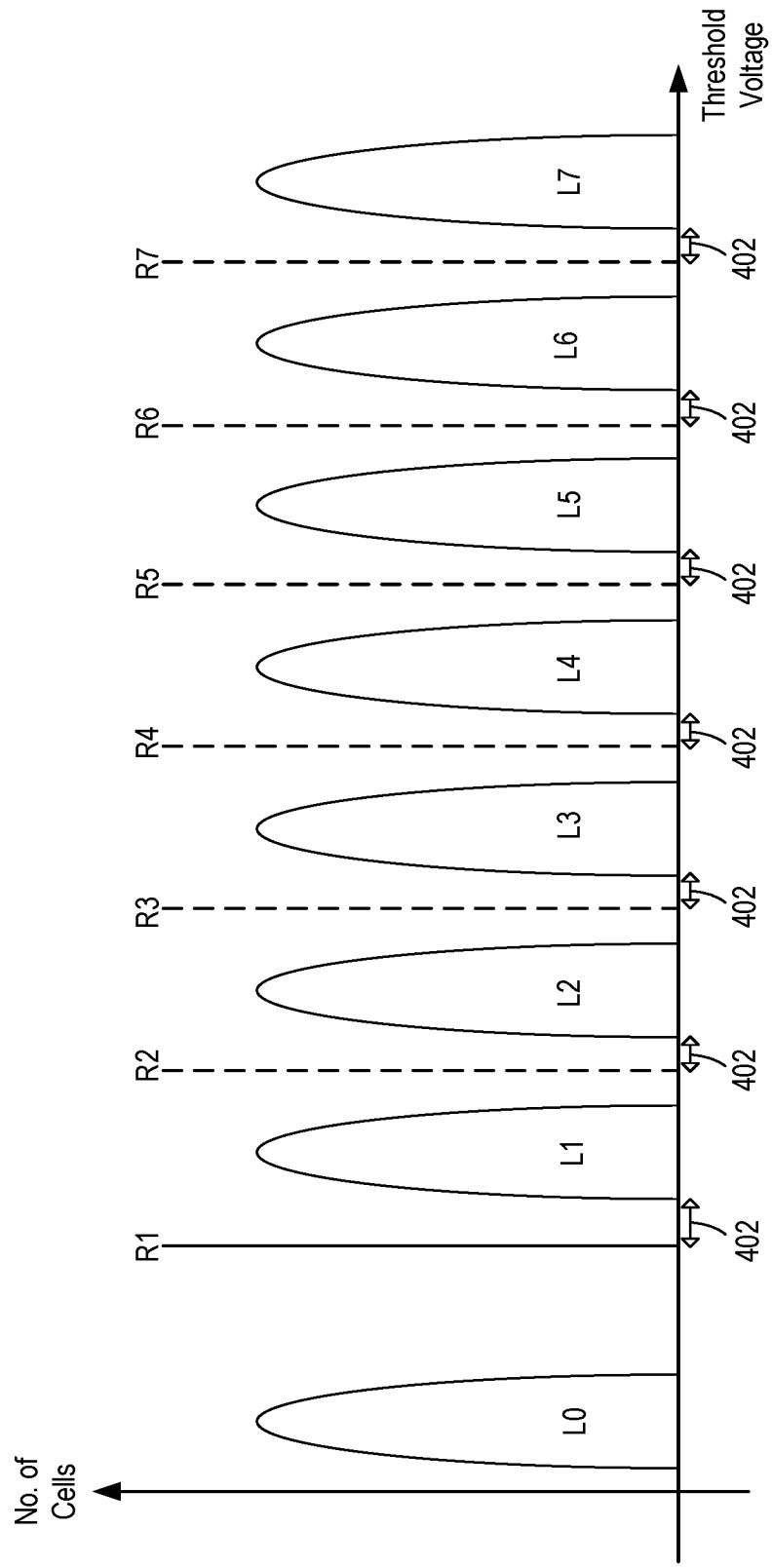
FIG. 4 is a conceptual diagram illustrating threshold voltage distribution of a flash cell that can store 3 bits per cell.

FIG. 4 is a conceptual diagram illustrating threshold voltage ($V_t$) distribution of a TLC cell that can store 3 bits per cell. A TLC cell has eight program states each corresponding to a 3-bit value. Different read voltages (e.g., R1, R2, R3, R4, R5, R6, and R7) are applied to the cell to determine its programmed threshold voltage. Due to various factors (e.g., process variation), different cells may have certain threshold voltage variations for the same bit value. FIG. 4 conceptual illustrates the threshold voltage distributions L0, L1, L2, L3, L4, L5, L6, and L7 for eight cell states. The difference between each $V_t$ distribution and a read voltage is called a threshold voltage ($V_t$) margin 402. Therefore, a tighter $V_t$ distribution (i.e., narrower $V_t$ distribution width) will increase the $V_t$ margin 402, leading to better data reliability.

For example, to store data in the flash array 302, the read/write circuitry 310 may load the data of a page into a buffer and program the threshold voltages of the cells according to the loaded data in the buffer. The buffer may be an SRAM embodied in the read/write circuitry 310 or the volatile memory 110. The read/write circuitry 310 may program a flash cell by applying a program voltage on the control gate of a transistor of a flash cell to trigger a charge transfer into a floating gate of a cell, thereby increasing the threshold voltage. To precisely control the threshold voltage of the cell, the read/write circuitry 310 may use incremental step pulse programming (ISPP). ISPP applies multiple short pulses of the programming voltage to the control gate, in order to increase the cell threshold voltage by some small voltage amount (Vstep) after each step or loop.

In general, the program process goes through a predetermined number of program loops. In each program loop, the read/write circuitry 310 applies a predetermined voltage pulse to a flash cell and verifies its threshold voltage after applying the voltage pulse. The programming process stops when the threshold voltage of all cells to be programmed reach the desired values or when a maximum loop count is reached. During programming of a page, a cell in that page cannot be read even if it is not being programmed to change its value. A read-write collision occurs when a read command is blocked by an ongoing write command for the same flash page. The delay results in a read latency that can be significant in some cases. In some embodiments, a program operation can be suspended before all the cells are programmed. When the program operation is suspended, the read/write circuitry 310 can read data from other cells that are not under programming. However, suspending a program/write command can introduce suspend latency that can be in the order of 150 μs to 250 μs.

Figure 5:
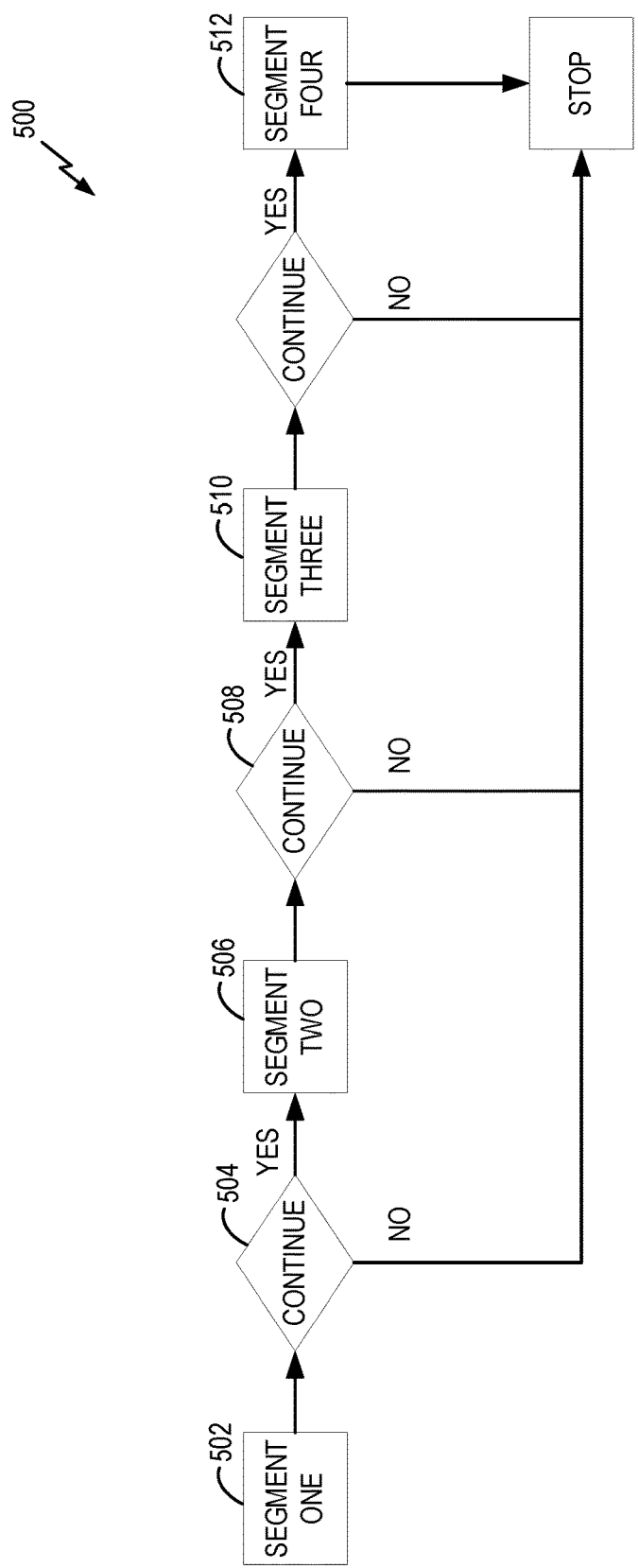
FIG. 5 is a flow chart illustrating a flash based memory program procedure using segmented writes in accordance with some embodiments.

FIG. 5 is a flow chart illustrating a segmented write procedure 500 for flash based storage according to some embodiments. The segmented write procedure 500 may be implemented at the SSD 104 (e.g., the controller 108 and/or a processor embedded within the NVM 112) described above in relation to FIGS. 1-3 or any flash based data storage. For example, the controller 108 may have data to be stored in the NVM 112. In an exemplary write process, the controller 108 may store the data into one or more flash chips 202 on CH0 (see FIG. 2) using a predetermined number of program loops. In some embodiments, the controller 108 may perform the program loops in multiple separate write segments, each including a certain number of the program loops. The write segments are separated by a predetermined delay referred to as dwell time in this disclosure. In some embodiments, the dwell time is greater than zero or no delay. Introducing a delay between the write segments may increase threshold voltage margins of the flash cells. It has been observed that introducing the dwell time between the write segments may lead to tighter $V_t$ distributions. Larger threshold voltage margins improve the overall system write performance.

Four exemplary write segments 502, 506, 510, and 512 are shown in FIG. 5. However, a different number of write segments may be used in other embodiments. After the controller 108 has performed a number of program loops in a first segment 502, the controller 108 determines in a decision block 504 whether all data has been successfully written into the flash chip. If all data has been written, the write process can stop; otherwise, the write process continues in a second segment 506. The starting program voltage of the second segment may be the same as the ending program voltage of the first segment Minimum dwell time is maintained between any two write segments. The upper bound of the dwell time may be limited by, for example, the write bandwidth requirement of the flash storage. In some embodiments, a tighter threshold voltage distribution can be obtained using dwell time of about 0.1 milliseconds (msec), about 1 msec, or about 10 msec. During the dwell time, the controller 108 may read data from other flash cells that are not being programmed.

After the controller 108 has performed a number of program loops in the second segment 506, the controller 108 determines in decision block 508 whether all data has been successfully written into the flash based storage. If all data has been written, the write process can stop; otherwise, the write process continues in a third segment 510. Similarly, the write process may continue in a fourth segment 512 until all write segments are completed, or all data has been written.

Before the write process of a page is completed, the controller 108 issues no new program command to write data on a logic unit including the page under programming until all write segments are completed to ensure that the data to be programmed and its associated intermediate verify data are still valid in the NAND page registers or buffers. However, reads that are scheduled for the same die can be immediately issued during the dwell time without incurring any suspend latencies.

Figure 6:
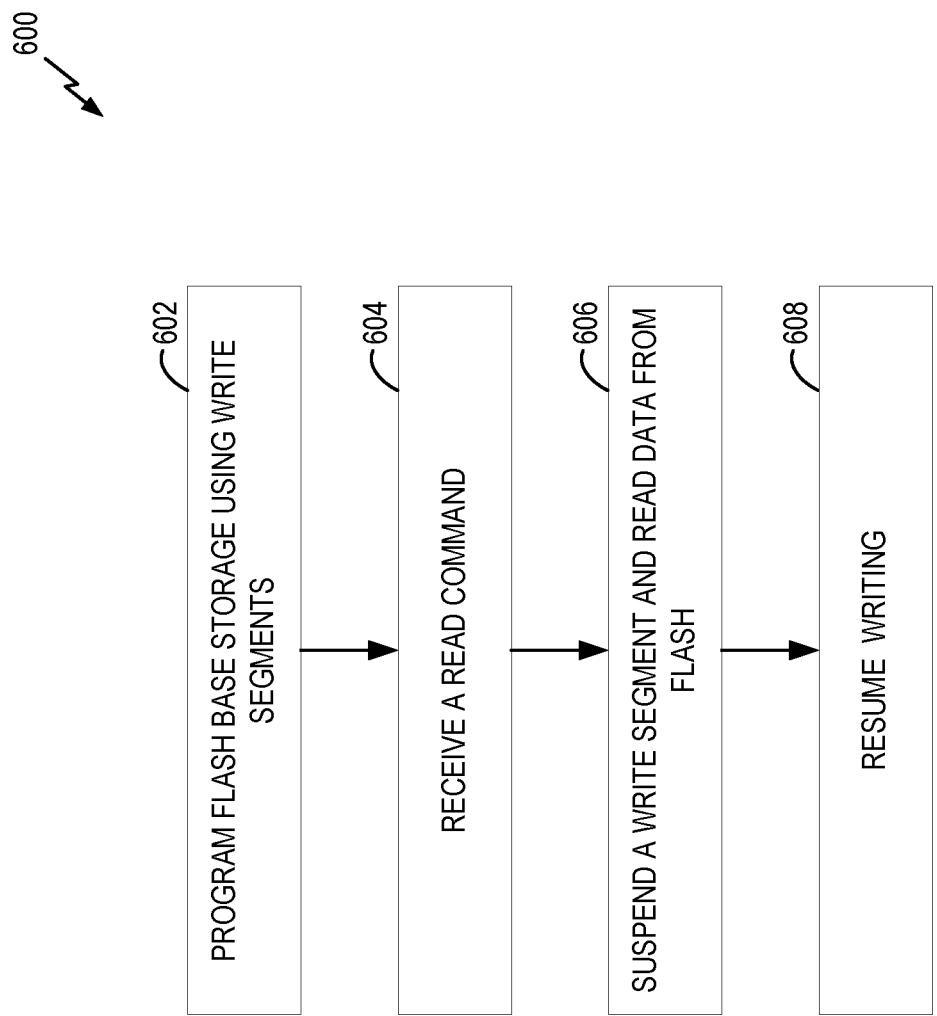
FIG. 6 is a flow chart illustrating a process for suspending a write segment in accordance with some embodiments.

FIG. 6 is a flow chart illustrating a process 600 for suspending a write segment according to some embodiments. The process 600 may be implemented at the SSD 104 (e.g., the controller 108 and/or a processor embedded within the NVM 112) described above in relation to FIGS. 1-3 or any flash based data storage. At block 602, the controller 108 may be programming data to the NVM 112 using a write process including a number of write segments as described above in relation to FIG. 5. At block 604, while still performing the write process, the controller 108 may receive a read command, for example, from the host 102 to read data from the NVM 112. In this case, the controller 108 can use a suspend operation to complement the segmented write process when an incoming read arrives during a write segment on the same flash die. At block 606, the controller 108 can suspend the write process, for example, during a write segment, to allow reading data from the same die. At block 608, the controller 108 resumes the suspended write segment after reading data from the NVM.

In some embodiments, the controller 108 may send a prefix command prior to issuing a program or write command to enable the segmented write process 500. When the segmented write process is enabled, the NVM 112 (e.g., read/write circuitry 310) may keep track of the program loops and program voltages across the segmented writes. The controller 108 may use a first command (e.g., 77h) to track the program state completion status for the entire write process, in addition to a second command (e.g., 70h) to track status (e.g., program pass/fail status) of program completion between write segments.

In some embodiments, system-level characterization for desired read performance and write performance trade-off analysis may be used to determine the total number of write segments (T_seg) used for a write process.

Figure 7:
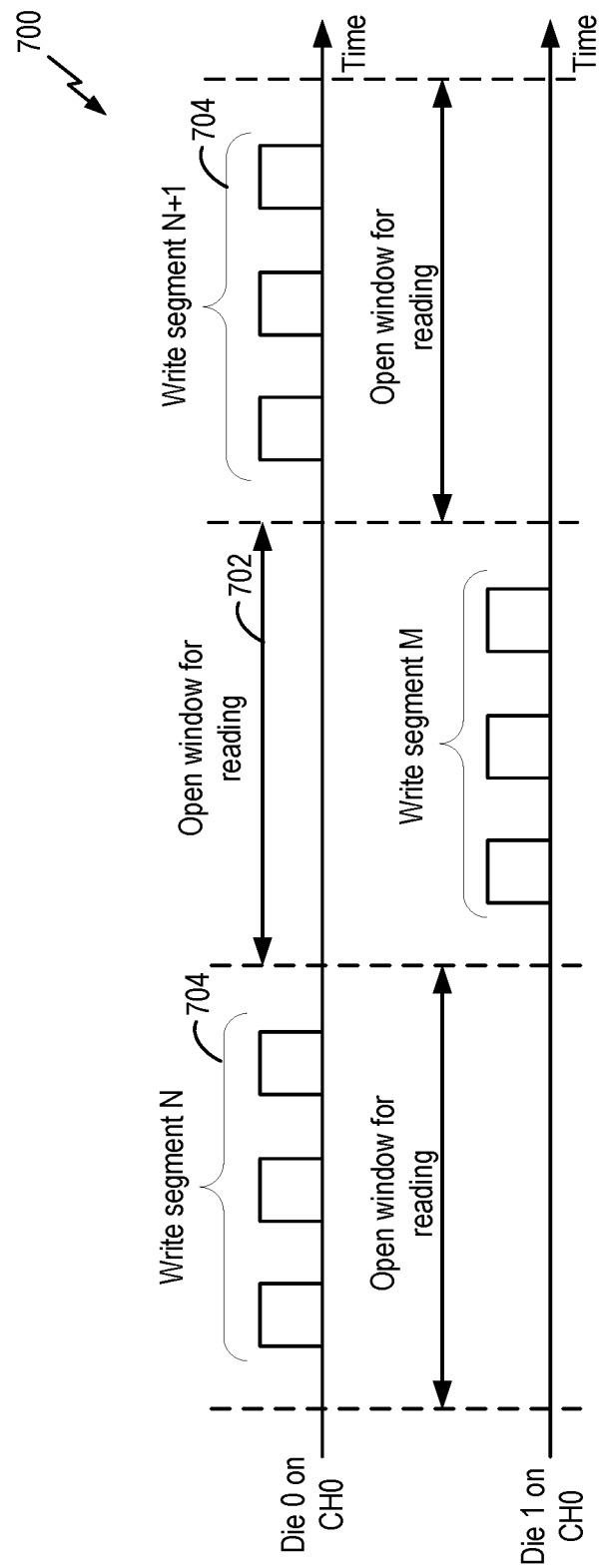
FIG. 7 is a diagram illustrating a flash based memory program procedure using staggered write segments in accordance with some embodiments.

FIG. 7 is a diagram illustrating a program procedure 700 using staggered write segments according to some embodiments. This program procedure 700 may be implemented using the SSD 104 described above in relation to FIGS. 1-3 or any flash based storages.

The controller 108 may use a write process similar to that described above in relation to FIG. 5 to program the NVM 112 using write segments. As illustrated in FIG. 2, the NVM 112 may include flash chips/dies arranged across different channels. Each channel may include multiple flash chips or dies. In some embodiments, the controller 108 may stagger the write segments to different flash chips/dies on the same channel. For example, the write segments N and N+1 and write segment M are staggered. That is, the write segments of die 0 are offset from the write segments of die 1. In one example, the controller 108 may write data to two dies (die 0 and die 1) on the same channel (e.g., CH0). In this case, the controller 108 can read data from die 0 in a time window 702 (i.e., dwell time) between two write segments 704 for writing data to die 0 that are separated by a predetermined dwell time. Similarly, the controller 108 can read data from die 1 in a time window between two write segments (only one write segment M is shown in FIG. 7) of die 1. Using staggered write segments, the SSD 104 may achieve better peak power control.

Figure 8:
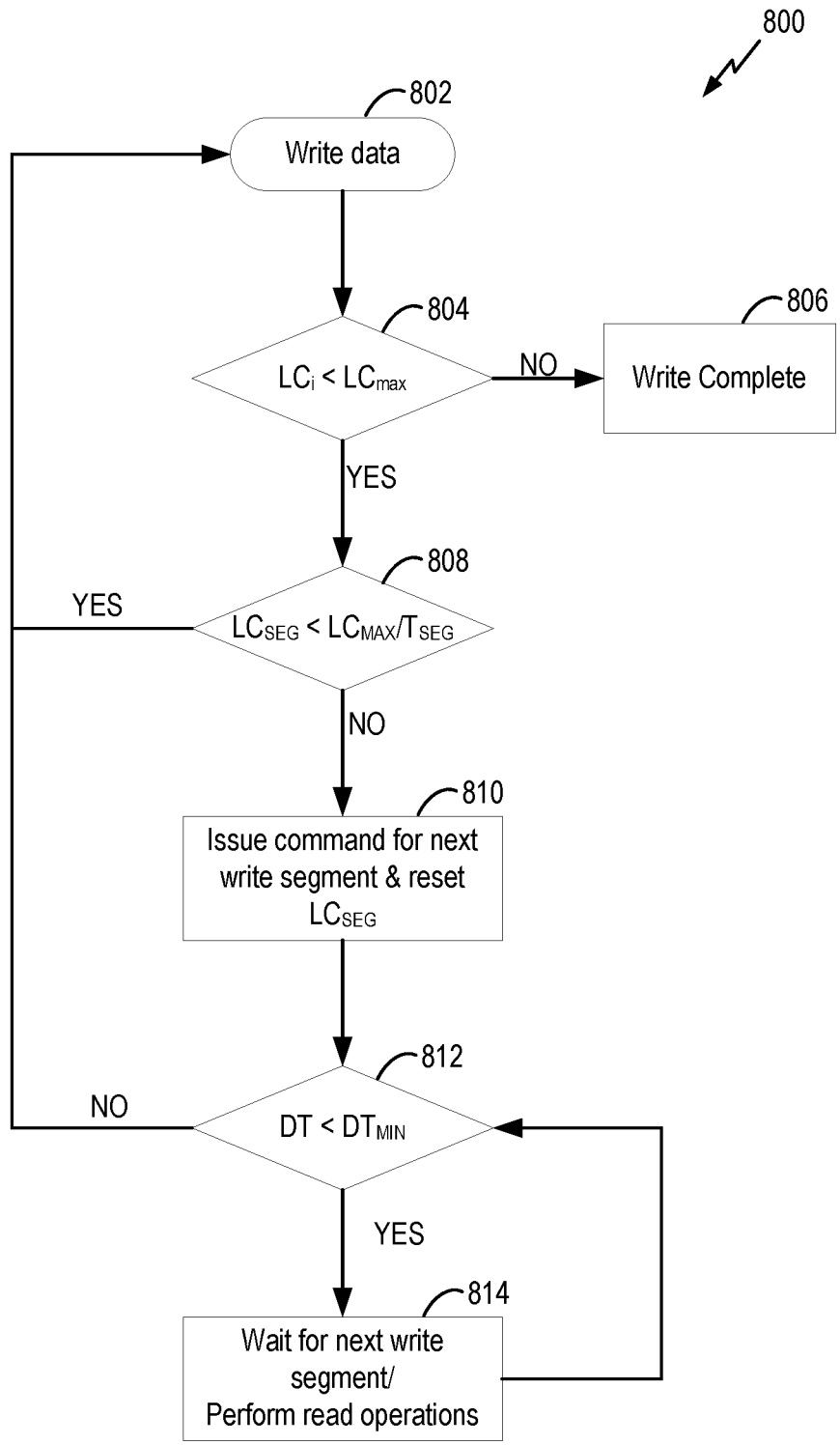
FIG. 8 is a flow chart illustrating a program process using write segments in accordance with some embodiments.

FIG. 8 is a flow chart illustrating a program process 800 using write segments according to some embodiments. The process 800 may be implemented at the SSD 104 (e.g., the controller 108 and/or a processor embedded within the NVM 112) described above in relation to FIGS. 1-3 or any flash based data storage. In one example, this process 800 may be used by the controller 108 to control the segmented write process 500 described above in relation to FIG. 5 or any segmented write processes.

At block 802, the controller 108 may write data to the NVM 112 (e.g., flash chips 202, 204, 206 of FIG. 2) across multiple channels using a segmented write process. For example, the controller 108 may write data to the NVM 112 in any of the write segments illustrated in FIG. 5. The write process has a predetermined maximum program loop count ($LC_{max}$) that determines the maximum number of program loops used to write data to the flash cells in a write process. Each write segment has a maximum segment loop count that limits the maximum number of program loops for that write segment. For example, the maximum segment loop count may be determined as $LC_{max}/T_{seg}$, where $T_{seg}$ is the total number of write segments of the write process.

At block 804, the controller 108 determines whether the current loop count ($LC_i$) is smaller than the maximum program loop count. If the current loop count is not smaller than the maximum program loop count, the write process is considered complete at block 806; otherwise, the process continues to block 808. The controller 108 checks the threshold voltages of the flash cells to be programmed after each program loop. When the cells are all programmed to the desired threshold voltages, the controller 108 can stop the write process even when the current loop count is smaller than the maximum program loop count.

At block 808, the controller 108 determines a segment loop count ($LC_{SEG}$) for the current write segment being programmed. If the segment loop count is smaller than the maximum segment loop count, the controller 108 continues to write data to the flash cells; otherwise, the controller 108 pauses the write process pauses and continues to block 810. For example, the controller 108 has written some data to the flash cells in the first write segment 502 (see FIG. 5) and pauses the write process for a predetermined dwell time.

At block 810, the controller 108 may issue a command for starting the next write segment (e.g., second write segment 506) and reset the segment loop count. In some examples, the controller 108 may issue a prefix command (e.g., 40h) followed by a program command to the NVM 112.

At block 812, the controller 108 determines whether or not a dwell time (DT) between write segments is smaller than a minimum dwell time ($DT_{MIN}$). The dwell time is a time delay in which writing to the NVM 112 is not performed or paused during a segmented write process similar to that described in relation to FIG. 5. If the dwell time is smaller than the minimum dwell time, the controller 108 waits before performing the next write segment in block 814. While the controller 108 waits for the next write segment, the controller 108 may read data from the flash cells that are not in a page being programmed by the current segmented write process. If the dwell time is not smaller than the minimum dwell time, the controller 108 may continue the write process in the next write segment. The above described segmented write process continues until the maximum loop count is reached or all cells have been programmed to the desired threshold voltages.

Figure 9:
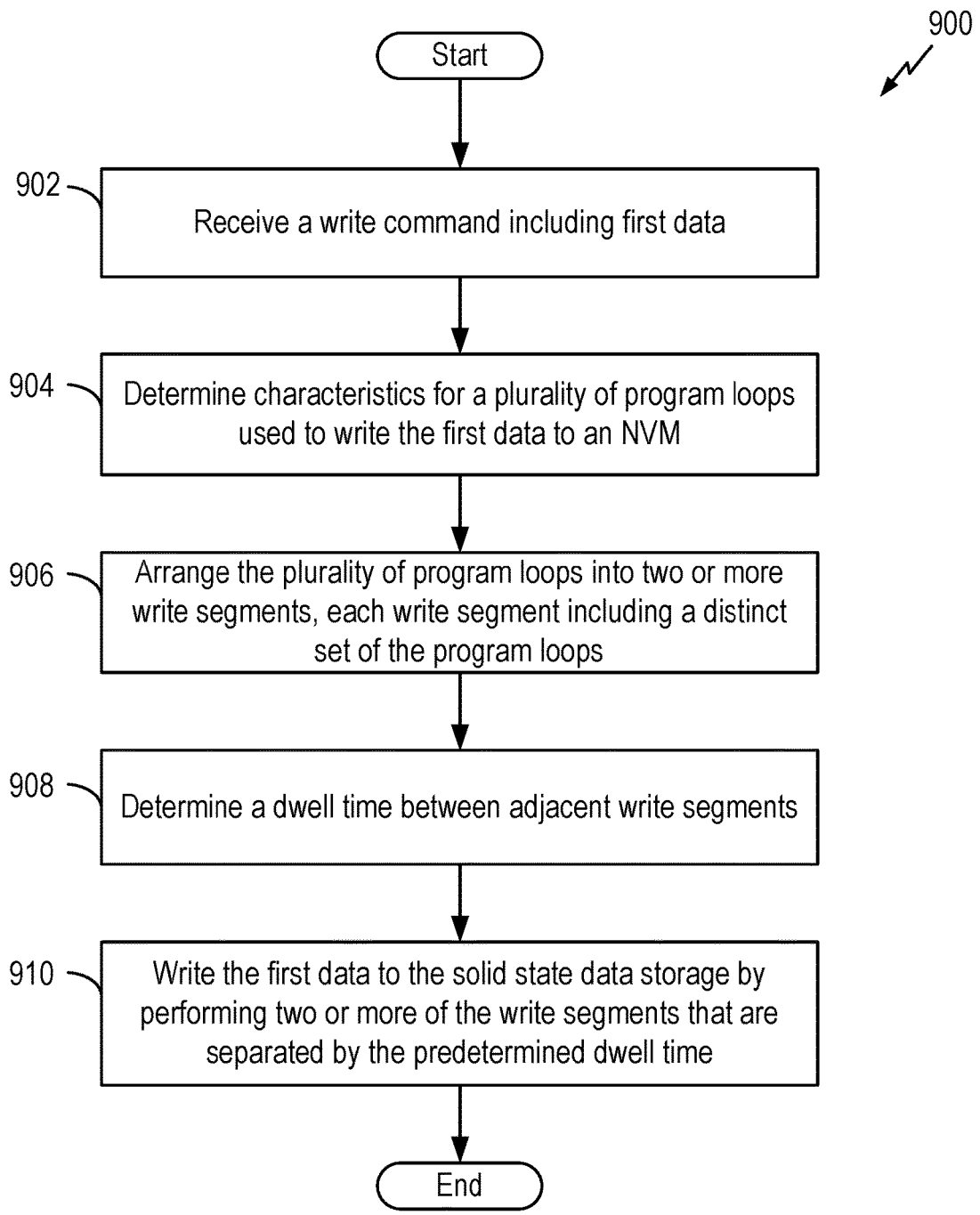
FIG. 9 is a flow chart illustrating a method for storing data in a solid state storage using a segmented write process in accordance with some embodiments.

FIG. 9 is a flow chart illustrating a method 900 for storing data in a solid state storage using a segmented write process according to some embodiments. The process 900 may be implemented at the SSD 104 (e.g., the controller 108 and/or a processor embedded within the NVM 112) described above in relation to FIGS. 1-3 or any flash based data storage. In one example, this process 900 may be performed using the SSD 104 or any flash based data storage.

At block 902, the controller 108 receives a write command from a host 102. The write command may include data to be stored in the NVM 112.

At block 904, the controller 108 determines characteristics for a plurality of program loops used to write first data to an NVM 112. For example, the characteristics may be a number of program loops and/or a desired threshold voltage programmed to a cell using the program loops. Based on the value of the first data, the controller 108 may determine the number of program loops needed to apply a plurality of program pulses to one or more cells of the NVM 112. The controller 108 may store the determined number of program loops in a buffer or memory (e.g., volatile memory 110) or memory included in the controller. In each program loop, the controller 108 can increase the threshold voltage of a cell by a certain amount. Therefore, the controller 108 first determines the desired cell threshold voltage for storing the data and determines the number of program loops needed to achieve that threshold voltage after programming. For example, the controller 108 (see FIG. 1) may need to store certain data in the NVM 112 that may include a plurality of flash chips 202, 204, and 206 arranged across multiple channels (see FIGS. 1 and 2). To that end, the controller 108 may write the data to the NVM 112 using a plurality of program loops. In each program loop, a program voltage is applied to the flash cells in the NVM 112 to be programmed to store data at a threshold voltage corresponding to the bit value. In some examples, each flash cell of the NVM 112 may store 3 bits per cell (e.g., TLS cells) with threshold voltage distributions similar to that shown in FIG. 4.

At block 906, the controller 108 arranges or divide the plurality of program loops into two or more write segments or groups. Each write segment includes a distinct set of the program loops. In one example, the write segments may be similar to those shown in FIG. 7 that shows a write segment N and a write segment N+1 for programming die 0 on CH0. Each write segment 704 may have three program loops for applying a program voltage to the cells. In some examples, the program voltage applied in each program loop may remain the same in a write segment. In other examples, the program voltage applied in each program loop may progressively increase in a write segment.

At block 908, the controller 108 determines a dwell time between adjacent write segments. The dwell time is a minimum delay between any two write segments. When the controller 108 inserts this dwell time between write segments, it can result in tighter threshold voltage distributions of the flash cells in the NVM 112. Therefore, threshold voltage margins can be increased, leading to improved data reliability. The dwell time may have an upper-bound constrained by, for example, the write bandwidth requirement of the system.

At block 910, the controller 108 writes the first data to the NVM 112 by performing two or more of the write segments that are separated by the predetermined dwell time. The controller 108 issues no new program command on the same logical unit that contains the page or cells to be programmed until all segments are completed to ensure that the data to be programmed and its associated intermediate verify data are still stored in the page registers of the NVM. However, the controller 108 can read data from the same flash cells between two write segments during the dwell time without suspending the segmented write process. Therefore, the controller 108 can avoid using a suspend operation, and the latency incurred due to a suspend operation can be avoided.

In some embodiments, a solid state drive (SSD) 104 may include means for performing the functions and processes described above in relation to FIGS. 1-9. For example, the controller 108 and/or read-write circuitry 210 may provide the means for determining a plurality of program loops for writing first data to a solid state data storage or NVM. The host interface 106, controller 108, and/or read-write circuitry 210 may provide the means for receiving a command from a host to transfer data between the host and the NVM. The controller 108 and/or read-write circuitry 210 may provide the means for arranging the plurality of program loops into two or more write segments, each write segment including a distinct set of the program loops. The controller 108 and/or read-write circuitry 210 may provide the means for determining a dwell time between adjacent write segments. The controller 108 and/or read-write circuitry 210 may provide the means for writing the first data to the solid state data storage by performing two or more of the write segments that are separated by the predetermined dwell time.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of operating a non-volatile memory (NVM), the method comprising:
   receiving a write command comprising first data;
   determining characteristics for a plurality of program loops used to write the first data to the NVM;
   grouping the plurality of program loops into a plurality of write segments, each write segment comprising a distinct set of the plurality of program loops;
   determining a dwell time between adjacent write segments; and
   writing the first data to the NVM by performing the plurality of write segments that are separated in time by the dwell time.

2. The method of claim 1, further comprising:
   reading second data from the NVM during the dwell time between adjacent write segments before completing all the write segments.

3. The method of claim 2,
   wherein the writing comprises writing the first data to a first flash die of the NVM via a data channel among a plurality of data channels, and
   wherein the reading comprises reading the second data from a second flash die of the NVM via the same data channel during the dwell time.

4. The method of claim 2, further comprising:
   receiving a first command for writing the first data to the NVM; and
   receiving a second command for reading the second data from the NVM,
   wherein the second command is received after the first command.

5. The method of claim 4, wherein the first command is received prior to writing the first data to the NVM, and the second command is received prior to completing the plurality of write segments.

6. The method of claim 1, wherein determining the dwell time comprises determining the dwell time based on a write bandwidth requirement of the NVM.

7. The method of claim 1,
   wherein the adjacent write segments comprise a first write segment and a second write segment, and
   wherein a starting program voltage of the second write segment is based on an ending program voltage of the first write segment.

8. The method of claim 1, wherein the writing comprises:
   determining a program loop count for a current write segment;
   if the program loop count is smaller than a maximum loop count of the current write segment, continuing writing the first data to the NVM; and
   if the program loop count is not smaller than the maximum loop count of the current write segment, ending the writing of the current write segment.

9. The method of claim 1, wherein the writing comprises:
   performing a first write segment of the plurality of write segments to write the first data to the NVM;
   waiting for the dwell time; and
   performing a second write segment of the plurality of write segments to write the first data to the NVM after waiting for the dwell time.

10. A solid state device (SSD) comprising:
    a non-volatile memory (NVM), and
    a controller operatively coupled to the NVM;
    wherein the controller is configured to:
      receive a write command comprising first data;
      determine characteristics for a plurality of program loops used to write the first data to the NVM;
      group the plurality of program loops into a plurality of write segments, each write segment comprising a distinct set of the program loops;
      determine a dwell time between adjacent write segments; and
      write the first data to the NVM by performing the plurality of write segments that are separated by the dwell time.

11. The SSD of claim 10, wherein the controller is further configured to:
    read second data from the NVM during the dwell time between adjacent write segments before completing all the write segments.

12. The SSD of claim 11, wherein the controller is further configured to:
    write the first data to a first flash die of the NVM via a data channel among a plurality of data channels; and
    read the second data from a second flash die of the NVM via the same data channel during the dwell time.

13. The SSD of claim 11, wherein the controller is further configured to:
    receive a first command including the write command for writing the first data to the NVM; and
    receive a second command for reading the second data from the NVM, wherein the second command is received after the first command.

14. The SSD of claim 13, wherein the controller is further configured to:
    receive the first command prior to writing the first data to the NVM; and
    receive the second command prior to completing the plurality of write segments.

15. The SSD of claim 10, wherein the controller is further configured to:

determine the dwell time based on a write bandwidth requirement of the NVM.

16. The SSD of claim 10,
wherein the adjacent write segments comprise a first write segment and a second write segment, and
wherein a starting program voltage of the second write segment is based on an ending program voltage of the first write segment.

17. The SSD of claim 10, wherein the controller is further configured to write the first data to the NVM by:
determining a program loop count for a current write segment;
if the program loop count is smaller than a maximum loop count of the current write segment, continuing writing the first data to the NVM; and
if the program loop count is not smaller than the maximum loop count of the current write segment, ending the writing of the current write segment.

18. The SSD of claim 10, wherein the controller is further configured to write the first data to the NVM by:
performing a first write segment of the plurality of write segments to write the first data to the NVM;
waiting for the dwell time; and
performing a second write segment of the plurality of write segments to write the first data to the NVM after waiting for the dwell time.

19. A non-volatile memory (NVM) comprising:
means for receiving a write command comprising first data;
means for determining characteristics for a plurality of program loops used to write the first data to the NVM;
means for grouping the plurality of program loops into a plurality of write segments, each write segment comprising a distinct set of the plurality of program loops;
means for determining a dwell time between adjacent write segments; and
means for writing the first data to the NVM by performing the plurality of write segments that are separated in time by the dwell time.

20. The NVM of claim 19, further comprising:
means for reading second data from the NVM during the dwell time between adjacent write segments before completing all the write segments.

21. The NVM of claim 20,
wherein the means for writing is configured to write the first data to a first flash die of the NVM via a data channel among a plurality of data channels, and
wherein the means for reading is configured to read the second data from a second flash die of the NVM via the same data channel during the dwell time.

22. The NVM of claim 20, further comprising:
means for receiving a first command including the write command for writing the first data to the NVM; and
means for receiving a second command for reading the second data from the NVM, wherein the second command is received after the first command.

23. The NVM of claim 22, wherein the first command is received prior to writing the first data to the NVM, and the second command is received prior to completing the plurality of write segments.

24. The NVM of claim 19, wherein the means for determining the dwell time is configured to determine the dwell time based on a write bandwidth requirement of the NVM.

25. The NVM of claim 19,
wherein the adjacent write segments comprise a first write segment and a second write segment, and
wherein a starting program voltage of the second write segment is based on an ending program voltage of the first write segment.

26. The NVM of claim 19, wherein the means for writing is configured to:
determine a program loop count for a current write segment;
if the program loop count is smaller than a maximum loop count of the current write segment, continue writing the first data to the NVM; and
if the program loop count is not smaller than the maximum loop count of the current write segment, end the writing of the current write segment.

27. The NVM of claim 19, wherein the means for writing is configured to:
perform a first write segment of the plurality of write segments to write the first data to the NVM;
wait for the dwell time; and
perform a second write segment of the plurality of write segments to write the first data to the NVM after waiting for the dwell time.

\* \* \* \* \*